United States Patent [19]

Fazekas et al.

[11] Patent Number: 4,611,119
[45] Date of Patent: Sep. 9, 1986

[54] METHOD OF EMPHASIZING A SUBJECT AREA IN A SCANNING MICROSCOPE

[75] Inventors: Peter Fazekas, Munich; Johann Otto, Bad Tölz, both of Fed. Rep. of Germany

[73] Assignee: Siemens Aktiengesellschaft, Berlin & Munich, Fed. Rep. of Germany

[21] Appl. No.: 520,461

[22] Filed: Aug. 4, 1983

[30] Foreign Application Priority Data

Sep. 27, 1982 [DE] Fed. Rep. of Germany ....... 3235727

[51] Int. Cl.$^4$ ........................................... G01N 23/00
[52] U.S. Cl. ..................................... 250/307; 250/310
[58] Field of Search ............... 250/307, 310, 311, 309, 250/397

[56] References Cited

U.S. PATENT DOCUMENTS

| | | | |
|---|---|---|---|
| 3,628,012 | 12/1971 | Plows et al. | 250/307 |
| 3,795,808 | 3/1974 | Drayton et al. | 250/311 |
| 4,020,343 | 4/1977 | Shimaya et al. | 250/311 |
| 4,071,759 | 1/1978 | Namae | 250/310 |
| 4,431,915 | 2/1984 | Nakagawa et al. | 250/310 |

Primary Examiner—Bruce C. Anderson
Attorney, Agent, or Firm—Hill, Van Santen, Steadman & Simpson et al.

[57] ABSTRACT

A method for emphasizing a portion of an area of a subject being scanned by a scanning microscope wherein a subject is scanned with a particle probe of the microscope moving at a given scanning speed along a line with a given space between lines and wherein the image is reproduced on the image recording device having a given scanning speed along each image line and a given spacing between the image lines characterized by enlarging selected portions of the image by selectively varying the scanning speed and spacing between the lines of at least one of the particle probe and image recording devices. The method enables producing an enlarged portion of an area of the subject being observed with the surrounding portions of the area being simultaneously produced to enable a significantly faster and more reliable discovery of the portion of the area of the subject which is of interest.

2 Claims, 2 Drawing Figures

METHOD OF EMPHASIZING A SUBJECT AREA IN A SCANNING MICROSCOPE

BACKGROUND OF THE INVENTION

The present invention is directed to a method for emphasizing at least one portion of an area of a subject in a scanning microscope wherein the method of scanning includes conducting a particle probe of the microscope line-by-line over the area of the subject during scanning with a given step size in both the x and y directions and reproducing an image on an image recording device utilizing the same step size.

At the present, available scanning electron microscopes have both a particle probe and an image recording device which have scanning beams that scan an area in the x and y direction with a given step size of $\Delta x$ and $\Delta y$. Thus, both the probe and recording device scan in a line-by-line manner with the same scanning speed along each line and the same spacing between lines. An example of the method is disclosed by U.S. Pat. No. 3,628,012 which is incorporated by reference thereto.

Due to the regularity of the structures within an integrated circuit, it is desirable when seeking the measuring locations provided for checking the integrated circuits with an electron beam measuring installation to be able to reorient oneself with an overall view of the integrated circuit when observing small portions of the integrated circuit. Up to now, this problem was resolved by utilizing commercially available scanning electron microscopic devices which, as an orientation aid, have the possibility of offering a reproduction of a subject in two different sizes. Given such a known device, the selected portion of the area of the subject of interest can be selected on the basis of an overall image of the subject to be investigated with the assistance of a frame or image which is an overall image and then the portion of the subject which is of interest is then enlarged.

SUMMARY OF THE INVENTION

The present invention is directed to providing a method for emphasizing at least one portion of an area of a subject wherein the one portion of the subject area can be found significantly faster and more reliable than is possible according to the prior art. The present invention also enables viewing a portion of the area of the subject of interest in both an enlarged presentation as well as being part of the remaining portions of the investigated subject.

The object of the present invention is obtained by an improvement in a method of scanning an area with a scanning microscope in an x and y direction, said method including the steps of conducting a particle probe of the microscope over a subject in a line-by-line manner with a given scanning speed along each line and a given spacing between lines to have a given step size in both the x and y directions and reproducing an image on an image recording device in a line-by-line manner by utilizing the given scanning speed along each image line and the given spacings between the image lines. The improvement comprises selectively changing or varying at least the scanning speed or at least the spacing between lines of one of the particle probes and the image recording device so that at least one portion of the area of the subject appears on the image recording device with a greater magnification than the remaining portions of the area. The method can be accomplished wherein the movement or scanning of the particle probe over the area has varying speeds on each line and varying spacing between the lines but the scan of the image recording device remains with a constant spacing and scanning speed. The method can also be accomplished by maintaining the scanning rate and spacing for the particle probe constant while varying the scanning rate or speed and the spacing between the lines of the image recording device.

DESCRIPTION OF THE PREFERRED EMBODIMENTS

Figure 1:
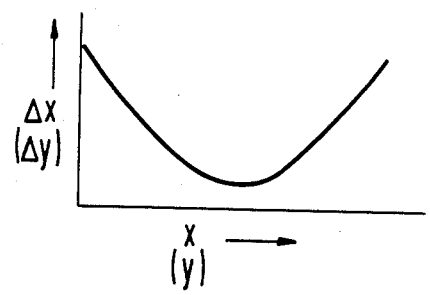
FIG. 1 is a graph illustrating movement of the electronic probe with variable step sizes or sweep rates at it is conducted over the surface of a subject to be scanned.

The principles of the present invention are particularly useful during a scanning of a subject with an electron probe. During the scanning, the electron probe is conducted over the specimen in an x-y plane in a line-by-line manner by a digital frame oscillator generator. The electron probe is thereby guided over the subject with a variable step size $\Delta x$ and $\Delta y$. As best illustrated in FIG. 1, a corresponding drive of the digital framing oscillator generator sees to it that this variable step size $\Delta x$ and $\Delta y$ is continuously reduced during the scanning in the x-y plane being reduced both in the x direction as well as in the y direction when extending in from the edge toward the center of the scanning field. In a reverse manner, the scanning rate or speed increases to have an enlarging step or rate as the probe moves from the center toward the edge of the field. Thus, the edge areas of the scanning field in the x-y plane are scanned with the largest step size $\Delta x$ and $\Delta y$ but the center of the scanning field in the x-y plane is scanned with the smaller step size $\Delta x$ and $\Delta y$.

Figure 2:
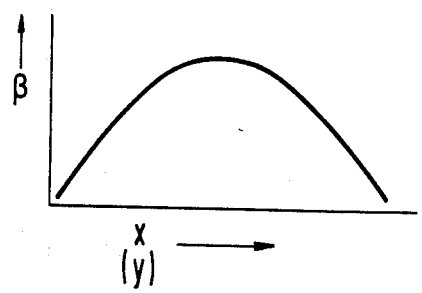
FIG. 2 is a graphical representation of the different enlargements of the selected portion of the picture screen.

FIG. 2 illustrates a reproduction of the scanning field which was scanned with the method utilized in FIG. 1. The reproduction of the image is produced on a picture screen whose electron beam is swept over the picture screen with a constant step size both along each image line and between the image lines. In this manner, the subject which was scanned with an electron probe in an electron microscope with the varying scanning rates or scanning steps will appear on the visual display as having a greater enlargement $\beta$ in the image center than at the edges of the image. Since the scanned subject field is again reproduced on the picture screen in an x-y plane, the enlargement $\beta$ of the subject at the edges of the picture screen is smaller than in the center of the picture screen.

As a result of this magnifying glass effect, the image of the portion of the subject area, which portion is of interest, is emphasized with greater enlargement whereas nonetheless the environment and thus the surrounding or remaining portion of the subject which surrounds the portion of interest is illustrated on the imaging device. An essential principle of the invention is that a portion of the area of the subject, which portion is of interest, can be displayed in an enlarged image and at the same time is produced with its surrounding regions which can also be monitored. Such a differently enlarged image on an image reproduction device can also be achieved in that the step size or sweep for the electron probe as it is conducted over the subject is kept constant and the step size or sweep of the beam of the image recording device is varied. On the one hand, both the step size with which the electron probe is conducted over the subject can be variably designed and the step size with which the image is displayed on the image recording device can be matched to the variable step size of the electron probe in a likewise variable manner. Such an arrangement enables achieving different magnifications of portions of the area of the subject by the image reproduction device.

Although various minor modifications may be suggested by those varied in the art, it should be understood that we wish to embody within the scope of the patent granted hereon, all such modifications as reasonably and properly come within the scope of our contribution to the art.

We claim:

1. In a method of scanning an area of a subject with a scanning microscope, said method including the steps of conducting a particle probe of the scanning microscope over the subject in a line-by-line manner with a given scanning speed along each line and a given spacing between the lines, and reproducing the image on an image recording device in a line-by-line manner by utilizing a given scanning speed along each image line and a given spacing between the image lines with the improvement comprising in the step of conducting a particle probe, continuously varying the scanning speed along each line of the particle probe and continuously varying the spacing between the lines during the scanning of each line while maintaining the scanning speed and spacing between lines constant at the image recording device so that the recorded image contains a magnified portion of an area of the subject with a greater magnification than the image of the portions surrounding the magnified portions.

2. In a method of scanning an area of a subject with a scanning microscope, said method including the steps of conducting a particle probe of the scanning microscope over the subject in a line-by-line manner with a given scanning speed along each line and a given spacing between the lines, and reproducing the image on an image recording device in a line-by-line manner by utilizing a given scanning speed along each image line and a given spacing between the image lines with the improvement comprising maintaining a constant scanning speed alonge each line and a constant spacing between lines of the particle probe and continuously varying the scanning speed along each image line and the spacing between the image line of the image recording device while recording each image line so that the recorded image contains a magnified portion of the area of a subject with a greater magnification than the portions surrounding the magnified portions.

* * * * *